(12) United States Patent
Harada et al.

(10) Patent No.: US 10,490,400 B2
(45) Date of Patent: Nov. 26, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Katsuyoshi Harada, Toyama (JP); Satoshi Shimamoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 65 days.

(21) Appl. No.: 15/933,085

(22) Filed: Mar. 22, 2018

(65) Prior Publication Data

US 2018/0308681 A1 Oct. 25, 2018

(30) Foreign Application Priority Data

Apr. 25, 2017 (JP) .................. 2017-086443

(51) Int. Cl.
| | |
|---|---|
| H01L 21/02 | (2006.01) |
| H01L 21/762 | (2006.01) |
| C23C 16/04 | (2006.01) |
| C23C 16/455 | (2006.01) |

(Continued)

(52) U.S. Cl.
CPC ........ *H01L 21/0228* (2013.01); *C23C 16/045* (2013.01); *C23C 16/34* (2013.01); *C23C 16/345* (2013.01); *C23C 16/45527* (2013.01); *C23C 16/45542* (2013.01); *H01L 21/0217* (2013.01); *H01L 21/02211* (2013.01); *H01L 21/02274* (2013.01); *H01L 21/67017* (2013.01); *H01L 21/67109* (2013.01); *H01L 21/76224* (2013.01)

(58) Field of Classification Search
None
See application file for complete search history.

(56) References Cited

U.S. PATENT DOCUMENTS

| | | | |
|---|---|---|---|
| 2008/0124945 A1 | 5/2008 | Miya et al. | |
| 2009/0170345 A1* | 7/2009 | Akae | ............ H01L 21/0214 |
| | | | 438/786 |

(Continued)

FOREIGN PATENT DOCUMENTS

| | | |
|---|---|---|
| JP | 2012-195564 A | 10/2012 |
| JP | 2013-093551 A | 5/2013 |
| WO | 2006/088062 A1 | 8/2006 |

*Primary Examiner* — Andres Munoz
(74) *Attorney, Agent, or Firm* — Volpe and Koenig, P.C.

(57) ABSTRACT

There is provided a technique that includes forming a nitride film on a pattern including a concave portion formed in a surface of a substrate by repeating a cycle. The cycle includes non-simultaneously performing: (a) forming a first layer by supplying a precursor gas to the substrate; (b) forming an NH-terminated second layer by supplying a hydrogen nitride-based gas to the substrate to nitride the first layer; and (c) modifying a part of the NH termination to an N termination, and maintaining another part of the NH termination as it is without modifying the another part to the N termination by plasma-exciting and supplying a nitrogen gas to the substrate, wherein in (c), an N termination ratio in an upper portion of the concave portion of the pattern is made higher than an N termination ratio in a lower portion of the concave portion of the pattern.

18 Claims, 7 Drawing Sheets

(51) Int. Cl.
*C23C 16/34* (2006.01)
*H01L 21/67* (2006.01)

(56) References Cited

U.S. PATENT DOCUMENTS

| | | | |
|---|---|---|---|
| 2010/0130024 A1* | 5/2010 | Takasawa | C23C 16/45531 438/761 |
| 2011/0129619 A1* | 6/2011 | Matsunaga | C23C 16/345 427/579 |
| 2012/0100722 A1* | 4/2012 | Asai | C23C 16/08 438/758 |
| 2012/0220137 A1 | 8/2012 | Ota et al. | |
| 2013/0171838 A1 | 7/2013 | Okuda | |
| 2013/0252437 A1* | 9/2013 | Sano | H01L 21/02247 438/769 |
| 2013/0252439 A1* | 9/2013 | Hirose | C23C 16/30 438/778 |
| 2017/0125238 A1* | 5/2017 | Hasebe | H01L 21/0217 |
| 2017/0178902 A1* | 6/2017 | Hashimoto | C23C 16/52 |
| 2019/0051512 A1* | 2/2019 | Kato | H01L 21/0217 |

\* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2017-086443, filed on Apr. 25, 2017, the entire contents of which are incorporated herein by reference.

BACKGROUND

Technical Field

The present disclosure relates to a method of manufacturing a semiconductor device, a substrate processing apparatus, and a recording medium.

Related Art

As one of the processes of manufacturing a semiconductor device, a process of forming a nitride film on a pattern including a concave portion such as a trench formed in a surface of a substrate may be performed (see, for example, WO 2006/088062).

SUMMARY

According to one embodiment of the present disclosure, there is provided a technique which, when forming a nitride film on a pattern including a concave portion formed in a surface of a substrate, can improve filling characteristics by the nitride film in the concave portion.

According to an aspect of the present disclosure, provided is a technique including: forming a nitride film on a pattern including a concave portion formed in a surface of a substrate by repeating a cycle including non-simultaneously performing: (a) forming a first layer by supplying a precursor gas to the substrate; (b) forming an NH-terminated second layer by supplying a hydrogen nitride-based gas to the substrate to nitride the first layer; and (c) modifying a part of the NH termination in the second layer to an N termination, and maintaining another part of the NH termination as it is without modifying the another part to the N termination by plasma-exciting and supplying a nitrogen gas to the substrate, wherein in (c), an N termination ratio of the second layer in an upper portion of the concave portion of the pattern is made higher than an N termination ratio of the second layer in a lower portion of the concave portion of the pattern.

DETAILED DESCRIPTION

Embodiment of Present Disclosure

Hereinafter, an embodiment of the present disclosure will be described with reference to FIGS. 1 to 6.

(1) Configuration of Substrate Processing Apparatus

Figure 1:
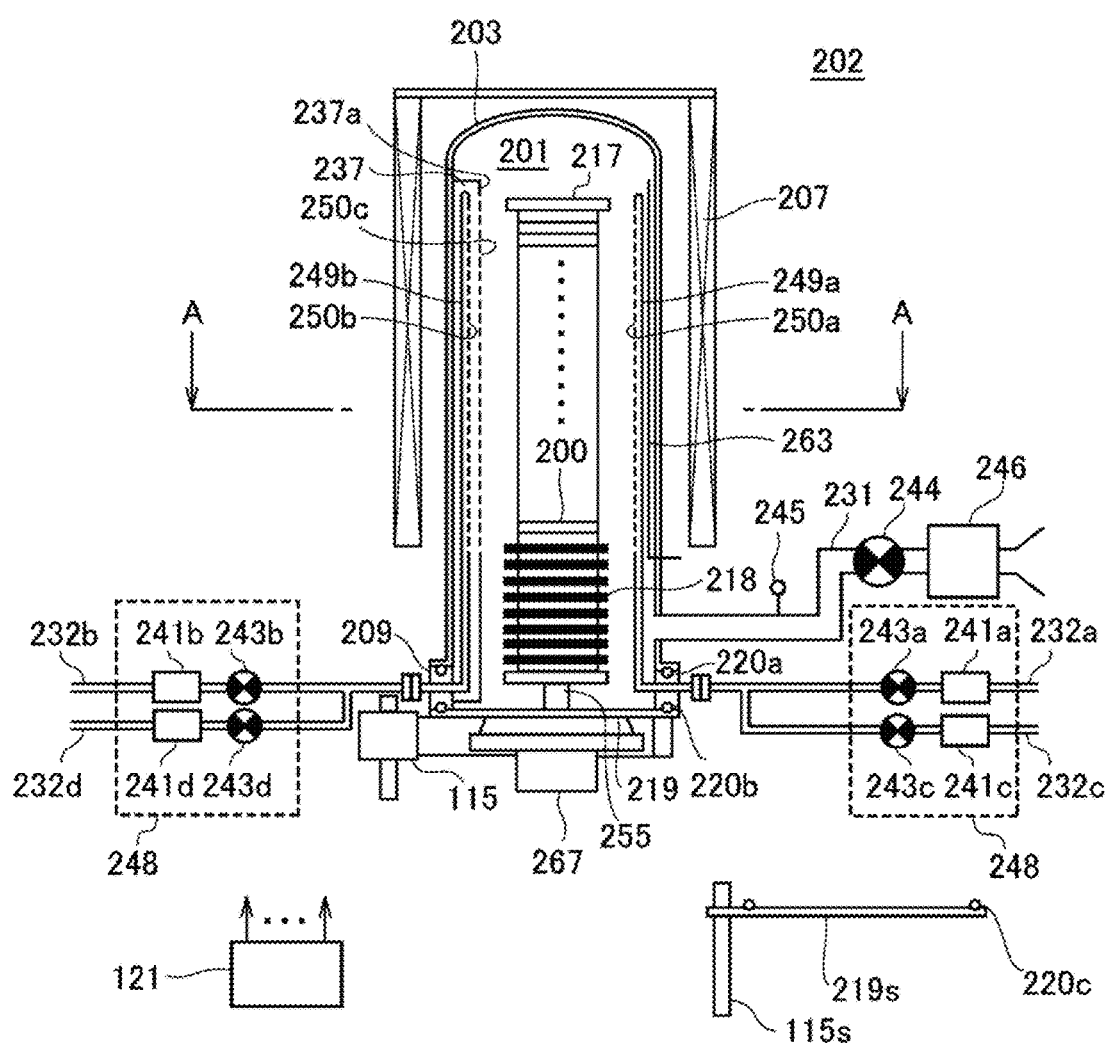
FIG. 1 is a schematic configuration diagram of a vertical process furnace of a substrate processing apparatus suitably used in an embodiment of the present disclosure and is a longitudinal sectional view of a process furnace part.

As illustrated in FIG. 1, a process furnace 202 includes a heater 207 serving as a heating mechanism (temperature regulation unit). The heater 207 has a cylindrical shape and is supported to a holding plate so that the heater 207 is vertically installed. The heater 207 also functions as an activation mechanism (excitation unit) that activates (excites) a gas by heat.

In the heater 207, a reaction tube 203 is disposed concentrically with the heater 207. The reaction tube 203 is made of a heat resistant material, such as quartz ($SiO_2$) or silicon carbide (SiC), and is formed to have a cylindrical shape with a closed upper end and an opened lower end. Under the reaction tube 203, a manifold 209 is disposed concentrically with the reaction tube 203. The manifold 209 is made of a metal, such as stainless steel (SUS), and is formed to have a cylindrical shape with an opened upper end and an opened lower end. An upper end part of the manifold 209 is configured to be engaged with a lower end part of the reaction tube 203 so as to support the reaction tube 203. An O-ring 220a serving as a seal member is provided between the manifold 209 and the reaction tube 203. Like the heater 207, the reaction tube 203 is vertically installed. The process vessel (reaction vessel) is configured by, mainly, the reaction tube 203 and the manifold 209. A process chamber 201 is formed in a cylindrical hollow part of the process vessel. The process chamber 201 is configured such that a wafer 200 as a substrate is accommodated.

In the process chamber 201, nozzles 249a and 249b are provided to pass through a sidewall of the manifold 209. Gas supply pipes 232a and 232b are respectively connected to the nozzles 249a and 249b.

Mass flow controllers (MFCs) 241a and 241b serving as flow rate controllers (flow rate sections) and valves 243a and 243b serving as on-off valves are respectively provided in the gas supply pipes 232a and 232b in this order from the upstream side of gas flow. Gas supply pipes 232c and 232d are respectively connected to the downstream side of the valves 243a and 243b of the gas supply pipes 232a and 232b. MFCs 241c and 241d and valves 243c and 243d are respectively provided in the gas supply pipes 232c and 232d in this order from the upstream side of gas flow.

Figure 2:
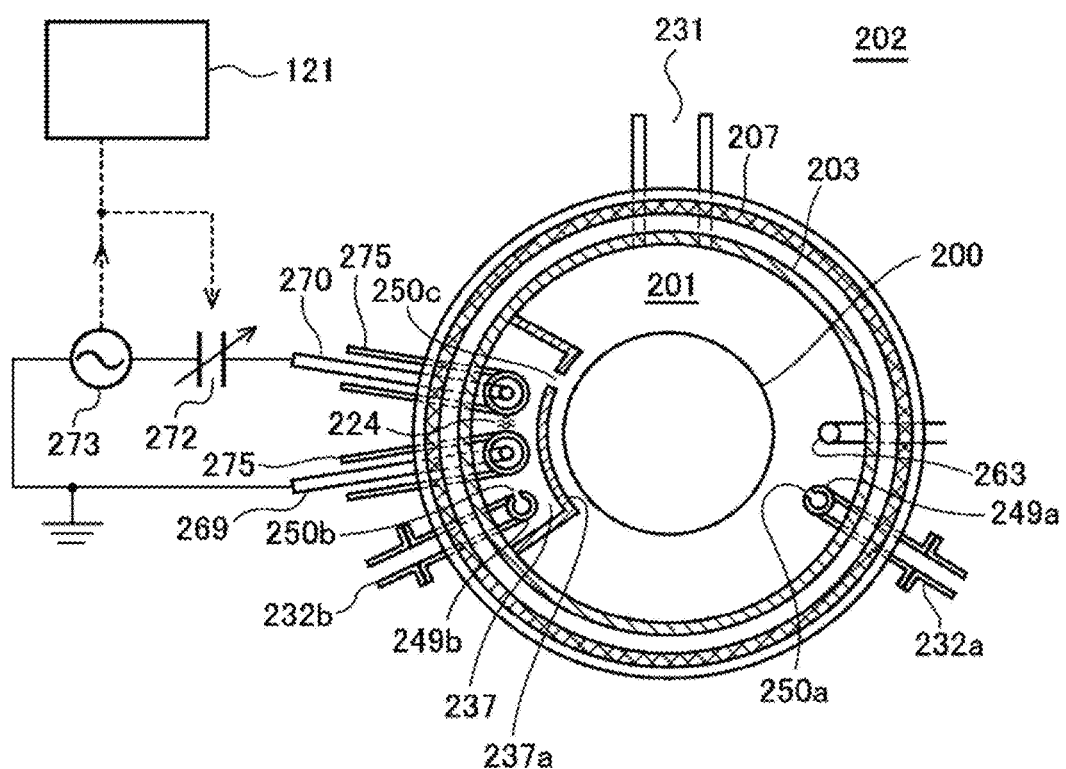
FIG. 2 is a schematic configuration diagram of the vertical process furnace of the substrate processing apparatus suitably used in the embodiment of the present disclosure and is a sectional view of the process furnace part, taken along line A-A of FIG. 1.

As illustrated in FIG. 2, the nozzles 249a and 249b are respectively provided in an annular space between an inner wall of the reaction tube 203 and the wafers 200, when seen in a plan view, so as to rise upward in a stacking direction of the wafers 200, along the upper part from the lower part of the inner wall of the reaction tube 203. That is, the nozzles 249a and 249b are provided in a region horizontally surrounding a wafer arrangement region, at a side of the wafer arrangement region in which the wafers 200 are arranged, along the wafer arrangement region. Gas supply holes 250a and 250b configured to supply a gas are respectively provided on side surfaces of the nozzles 249a and 249b. The gas supply hole 250a is opened to face the center of the reaction tube 203, so that the gas can be supplied toward the wafers 200. The gas supply hole 250b is opened to face a center of a buffer chamber 237 to be described below. The gas supply holes 250a and 250b are provided in plurality from the lower part to the upper part of the reaction tube 203.

The nozzle 249b is provided in the buffer chamber 237 that is a gas dispersion space. The buffer chamber 237 is formed between the inner wall of the reaction tube 203 and a partition wall 237a. The buffer chamber 237 (the partition wall 237a) is provided in the annular space between the inner wall of the reaction tube 203 and the wafers 200, when seen in a plan view, in the region from the lower part to the upper part of the inner wall of the reaction tube 203 in the stacking direction of the wafers 200. That is, the buffer chamber 237 (the partition wall 237a) is provided in a region horizontally surrounding the wafer arrangement region, at the side of the wafer arrangement region, along the wafer arrangement region. A gas supply hole 250c configured to supply a gas is provided at an end part of a surface of the partition wall 237a facing (adjacent to) the wafer 200. The gas supply hole 250c is opened to face the center of the reaction tube 203, so that the gas can be supplied toward the wafers 200. The gas supply hole 250c is provided in plurality from the lower part to the upper part of the reaction tube 203.

As a precursor, a halosilane-based gas containing silicon (Si) and a halogen element as a main element constituting a film to be formed is supplied from the gas supply pipe 232a to the process chamber 201 through the MFC 241a, the valve 243a, and the nozzle 249a. The precursor gas is a precursor of a gaseous state, for example, a gas obtained by vaporizing a precursor that is a liquid state under normal temperature and normal pressure, or a precursor that is a gaseous state under normal temperature and normal pressure. The halogen element includes chlorine (Cl), fluorine (F), bromine (Br), and iodine (I). The halosilane-based gas acts as a Si source. As the halosilane-based gas, for example, a chlorosilane-based gas containing Cl can be used. As the chlorosilane-based gas, for example, a dichlorosilane ($SiH_2Cl_2$, abbreviated to DCS) gas can be used.

As a reactant gas, a nitrogen (N)-containing gas is supplied from the gas supply pipe 232b into the process chamber 201 through the MFC 241b, the valve 243b, the nozzle 249b, and the buffer chamber 237. As the N-containing gas, for example, a hydrogen nitride-based gas can be used. The hydrogen nitride-based gas is a material consisting of two elements, i.e., N and hydrogen (H), and acts as a nitriding gas, that is, an N source. As the hydrogen nitride-based gas, for example, an ammonia ($NH_3$) gas can be used.

A nitrogen ($N_2$) gas is supplied from the gas supply pipes 232c and 232d into the process chamber 201 through the MFCs 241c and 241d, the valves 243c and 243d, the gas supply pipes 232a and 232b, the nozzles 249a and 249b, and the buffer chamber 237. The $N_2$ gas acts as a purge gas or a carrier gas. In addition, the $N_2$ gas supplied from the gas supply pipe 232d acts as a modifying gas by plasma excitation in step C to be described below.

A precursor gas supply system is configured by, mainly, the gas supply pipe 232a, the MFC 241a, and the valve 243a. A hydrogen nitride-based gas supply system is configured by, mainly, the gas supply pipe 232b, the MFC 241b, and the valve 243b. A nitrogen gas supply system is configured by, mainly, the gas supply pipes 232c and 232d, the MFCs 241c and 241d, and the valves 243c and 243d.

One or all of the various supply systems described above may be configured as an integrated supply system 248 in which the valves 243a to 243d, the MFCs 241 to 241d, or the like are integrated. The integrated supply system 248 is connected to each of the gas supply pipes 232a to 232d and is configured such that the operations of supplying various gases to the gas supply pipes 232a to 232d, that is, the operations of opening and closing the valves 243a to 243d, or the operations of adjusting the flow rates by the MFCs 241a to 241d are controlled by a controller 121 to be described below. The integrated supply system 248 is configured as an integration-type or division-type integrated unit, and it is possible to perform attachment and detachment with respect to the gas supply pipes 232a to 232d or the like on an integrated unit basis, and it is possible to perform maintenance, replacement, expansion, or the like of the integrated supply system 248 on an integrated unit basis.

In the buffer chamber 237, two rod-shaped electrodes 269 and 270 including a conductor and having an elongated structure are erected upward in the stacking direction of the wafers 200 along the upper part from the lower part of the inner wall of the reaction tube 203. The rod-shaped electrodes 269 and 270 are provided in parallel to the nozzle 249b. The rod-shaped electrodes 269 and 270 are covered with and protected by an electrode protection pipe 275 from the upper part to the lower part thereof. One of the rod-shaped electrodes 269 and 270 is connected to a radio frequency (RF) power source 273 through a matcher 272, and the other thereof is connected to earth (ground), which is a reference potential. By applying RF power from the RF power source 273 to the rod-shaped electrodes 269 and 270, plasma is generated in a plasma generation region 224 between the rod-shaped electrodes 269 and 270. A plasma excitation unit (activation mechanism) for exciting (activating) a gas into a plasma state is configured by, mainly, the rod-shaped electrodes 269 and 270 and the electrode protection pipe 275. The matcher 272 and the RF power source 273 may be included in the plasma excitation unit.

An exhaust pipe 231 is connected under the sidewall of the reaction tube 203 so as to exhaust the atmosphere of the process chamber 201. A vacuum pump 246 serving as a vacuum exhaust device is connected to the exhaust pipe 231 through a pressure sensor 245 serving as a pressure detector (pressure detection unit) which detects a pressure in the process chamber 201, and an auto pressure controller (APC) valve 244 serving as a pressure regulator (pressure regulation unit). The APC valve 244 is configured to perform a vacuum exhaust or a vacuum exhaust stop with respect to the process chamber 201 by opening or closing the valve while the vacuum pump 246 is operating, and to regulate the pressure in the process chamber 201 by adjusting the degree of valve opening based on pressure information detected by the pressure sensor 245 while the vacuum pump 246 is operating. An exhaust system is configured by, mainly, the exhaust pipe 231, the APC valve 244, and the pressure sensor 245. The vacuum pump 246 may be included in the exhaust system.

Under the manifold 209, a seal cap 219 is provided as a furnace throat lid that can airtightly close a lower end opening of the manifold 209. The seal cap 219 is made of a metal such as stainless steel (SUS) and is formed to have a disk shape. On the top surface of the seal cap 219, an O-ring 220b is provided as a seal member that abuts against the lower end of the manifold 209. A rotation mechanism 267 that rotates a boat 217 to be described below is installed under the seal cap 219. A rotational shaft 255 of the rotation mechanism 267 passes through the seal cap 219 and is connected to the boat 217. The rotation mechanism 267 is configured to rotate the wafers 200 by rotating the boat 217. The seal cap 219 is configured such that the seal cap 219 is moved upward and downward by a boat elevator 115 serving as an elevation mechanism installed outside the reaction tube 203. The boat elevator 115 is configured as a transfer device (transfer mechanism) that loads/unloads (transfers) the wafers 200 into/from the process chamber 201 by moving the seal cap 219 upward or downward. In addition, under the manifold 209, a shutter 219s is provided as a furnace throat lid that can airtightly close the lower end opening of the manifold 209 while the seal cap 219 is moved downward and the boat 217 is unloaded from the process chamber 201. The shutter 219s is made of a metal such as stainless steel (SUS) and is formed to have a disk shape. On the top surface of the shutter 219s, an O-ring 220c is provided as a seal member that abuts against the lower end of the manifold 209. The opening and closing operation (the upward and downward moving operation, the rotating operation, or the like) of the shutter 219s is controlled by a shutter opening/closing mechanism 115s.

The boat 217 serving as a substrate support is configured such that a plurality of sheets of wafers 200, for example, 25 to 200 wafers, are vertically aligned and supported in a horizontal posture, with their centers aligned with one another, in multiple stages, that is, arranged spaced apart from one another at predetermined intervals. The boat 217 is made of, for example, a heat resistant material such as quartz or SiC. Under the boat 217, a heat insulating plate 218, which is made of, for example, a heat resistant material such as quartz or SiC, is configured to be supported in multiple stages.

A temperature sensor 263 serving as a temperature detector is installed in the reaction tube 203. An amount of current to be supplied to the heater 207 is adjusted based on temperature information detected by the temperature sensor 263, so that the temperature in the process chamber 201 has a desired temperature distribution. The temperature sensor 263 is provided along the inner wall of the reaction tube 203.

Figure 3:
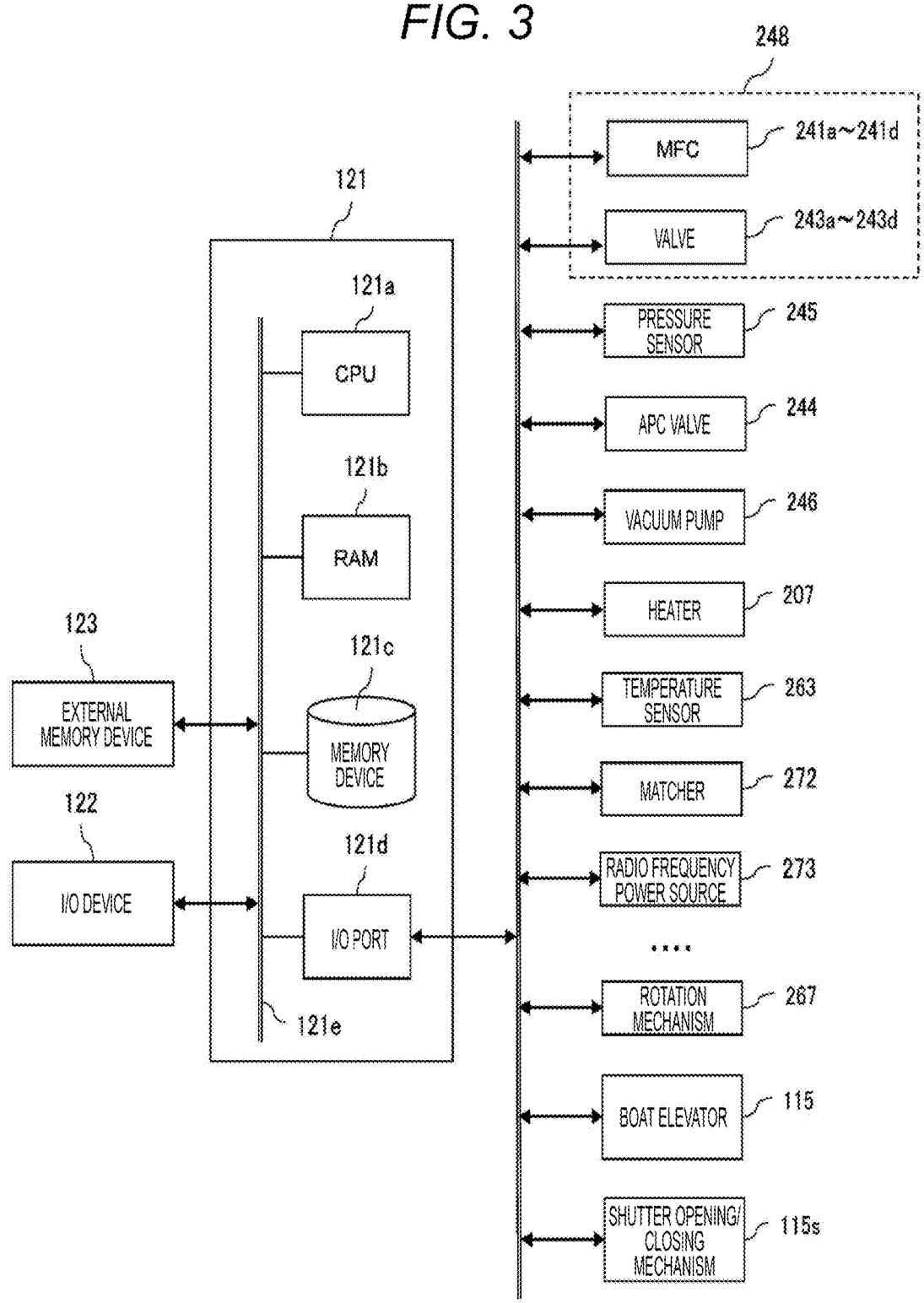
FIG. 3 is a schematic configuration diagram of a controller of the substrate processing apparatus suitably used in the embodiment of the present disclosure and is a block diagram of a control system of the controller.

As illustrated in FIG. 3, the controller 121 that is a controller (control device) is configured by a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122, which is configured as, for example, a touch panel or the like, is connected to the controller 121.

The memory device 121c is configured by, for example, a flash memory, a hard disk drive (HDD), or the like. In the memory device 121c, a control program for controlling an operation of a substrate processing apparatus or a process recipe including procedures or conditions of a film-forming process to be described below is stored to be readable. The process recipe is a combination of procedures of a film-forming process described below so as to obtain a desired result when the procedures are performed by the controller 121, and the process recipe functions as a program. Hereinafter, the process recipe, the control program, and the like will be simply and collectively referred to as a program. In addition, the process recipe is simply referred to as a recipe. When the term "program" is used in the present disclosure, it may be understood as including a recipe alone, a control program alone, or both of the recipe and the control program. The RAM 121b is configured as a memory area (work area) in which a program or data read by the CPU 121a is temporarily retained.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s, the matcher 272, the RF power source 273, and the like.

The CPU 121a is configured to read and execute the control program from the memory device 121c and to read the recipe from the memory device 121c according to an input of an operation command from the I/O device 122, or the like. According to the contents of the read recipe, the CPU 121a is configured to control the operation of adjusting the flow rates of various gases by using the MFCs 241a to 241d, the operation of opening/closing the valves 243a to 243d, the operation of opening/closing the APC valve 244, the operation of adjusting the pressure by using the APC valve 244 based on the pressure sensor 245, the operation of driving and stopping the vacuum pump 246, the operation of adjusting the temperature of the heater 207 based on the temperature sensor 263, the operation of rotating the boat 217 and adjusting the rotating speed of the boat 217 by using the rotation mechanism 267, the operation of moving the boat 217 upward or downward by using the boat elevator 115, the operation of opening and closing the shutter 219s by using the shutter opening/closing mechanism 115s, the operation of adjusting impedance by using the matcher 272, the operation of controlling the supply of power to the RF power source 273, and the like.

The controller 121 can be configured by installing, on a computer, the program stored in an external memory device (for example, a magnetic disk such as an HDD, an optical disk such as a CD, a magneto-optical disk such as an M, or a semiconductor memory such as a USB memory) 123. The memory device 121c or the external memory device 123 is configured as anon-transitory computer-readable recording medium. Hereinafter, the memory device 121c and the external memory device 123 may be simply and collectively referred to as a recording medium. When the term "recording medium" is used in the present disclosure, it may be understood as including the memory device 121c alone, the external memory device 123 alone, or both of the memory device 121c and the external memory device 123. The provision of the program to the computer may be performed by using a communication unit such as the Internet or dedicated lines, without using the external memory device 123.

(2) Film-Forming Process

As one of the processes of manufacturing a semiconductor device, an example of a sequence of forming a silicon nitride film (SiN film) on a wafer 200 as a substrate by using the above-described substrate processing apparatus will be described with reference to FIG. 4. In the present embodiment, an example in which a substrate having a pattern including a concave portion such as a trench formed in a surface thereof is used as the wafer 200 will be described. In the following description, the operations of the respective elements constituting the substrate processing apparatus are controlled by the controller 121.

Figure 4:
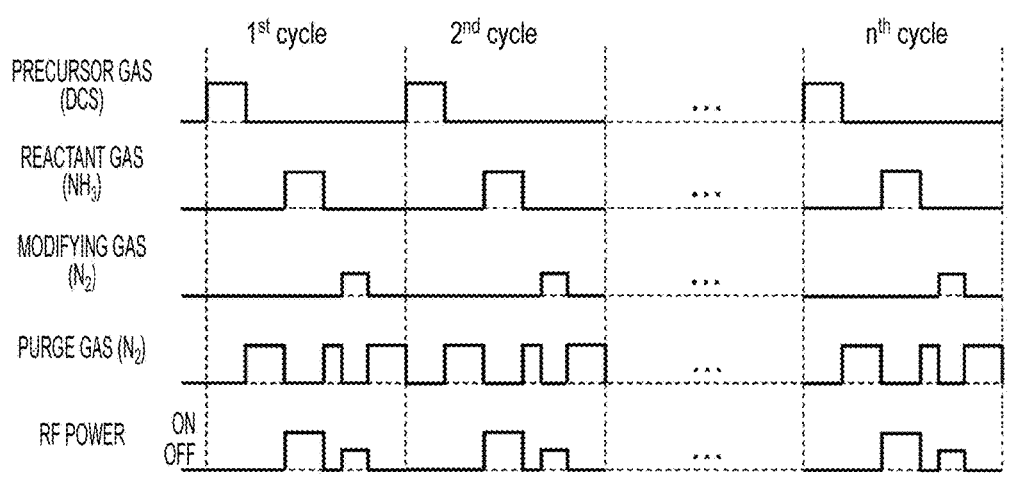
FIG. 4 is a diagram illustrating a film-forming sequence according to an embodiment of the present disclosure.

In a film-forming sequence illustrated in FIG. 4, a SiN film is formed on a pattern including a concave portion formed in the surface of the wafer 200 by repeating a cycling including non-simultaneously performing: step A of forming a first layer by supplying a DCS gas as a precursor gas to the wafer 200; step B of forming an NH-terminated second layer by supplying a $NH_3$ gas as a hydrogen nitride-based gas to the wafer 200 to nitride the first layer; and step C of modifying a part of the NH termination in the second layer to an N termination, and maintaining another part of the NH termination as it is without modifying the another part to the N termination by plasma-exciting and supplying a $N_2$ gas to the wafer 200.

In step C, an N termination ratio of the second layer at the upper portion of the trench of the pattern is made higher than an N terminal ratio of the second layer at the lower portion of the trench of the pattern. In this case, by repeating the cycle, a SiN film can be formed while a thickness of the layer (layer formed per cycle) to be formed at the lower portion of the trench of the pattern is made thicker than a thickness of the layer (layer formed per cycle) to be formed at the upper portion of the trench of the pattern. As a result, it is possible to realize a bottom-up film formation in which the filling of the SiN film gradually proceeds from the lower portion to the upper portion of the trench, and it is possible to fill the trench of the pattern with the SiN film in without a gap.

In the present disclosure, for convenience, the film-forming sequence illustrated in FIG. 4 may be represented as follows. In the following descriptions of modification examples, the same notation is used.

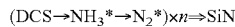

$(DCS \rightarrow NH_3^* \rightarrow N_2^*) \times n \Rightarrow SiN$

When the term "wafer" is used in the present disclosure, it may be understood as a wafer itself, or a laminate of a wafer and a predetermined layer or film formed on a surface thereof. When the term "a surface of a wafer" is used in the present disclosure, it may be understood as "a surface of a wafer itself" or "a surface of a predetermined layer or the like formed on a wafer." When the expression "a predetermined layer is formed on a wafer" is used in the present disclosure, it may be understood to mean that "a predetermined layer is directly formed on a surface of a wafer itself" or mean that "a predetermined layer is formed on a layer or the like formed on a wafer." A case where the term "substrate" is used in the present disclosure is synonymous with the case where the term "wafer" is used.

(Wafer Charging and Boat Loading)

When a plurality of sheets of wafers 200 are charged into the boat 217 (wafer charging), the shutter 219s is moved by the shutter opening/closing mechanism 115s and the lower end opening of the manifold 209 is opened (shutter opening). After that, as illustrated in FIG. 1, the boat 217 that supports the plurality of sheets of wafers 200 is lifted by the boat elevator 115 and is loaded into the process chamber 201 (boat loading). In this state, the seal cap 219 is in a state of sealing the lower end of the manifold 209 through the O-ring 220b.

(Pressure Adjustment and Temperature Adjustment)

The inside of the process chamber 201, that is, the space where the wafers 200 are present, is vacuum-exhausted (exhausted under reduced pressure) to have a desired pressure (degree of vacuum) by the vacuum pump 246. In this case, the pressure in the process chamber 201 is measured by the pressure sensor 245, and the APC valve 244 is feedback-controlled based on information about the measured pressure. In addition, the wafers 200 in the process chamber 201 are heated by the heater 207 so as to have a desired process temperature. In this case, an amount of current supplied to the heater 207 is feedback-controlled based on the temperature information detected by the temperature sensor 263, so that the inside of the process chamber 201 has a desired temperature distribution. In addition, the rotation of the wafers 200 is started by the rotation mechanism 267. The operation of the vacuum pump 246 and the heating and rotation of the wafers 200 are continuously performed at least until the processing on the wafers 200 is completed.

(Film-Forming Step)

After that, the following three steps, that is, steps A to C, are sequentially performed.

[Step A]

In this step, a DCS gas is supplied to the wafers 200 in the process chamber 201.

Specifically, the valve 243a is opened so that the DCS gas flows into the gas supply pipe 232a. The DCS gas, the flow rate of which is controlled by the MFC 241a, is supplied to the process chamber 201 through the nozzle 249a and is exhausted from the exhaust pipe 231. At this time, the DCS gas is supplied to the wafers 200. At this time, the valves 243c and 243d may be opened so that a $N_2$ gas flows into the gas supply pipes 232c and 232d. The $N_2$ gas, the flow rate of which is adjusted by the MFCs 241c and 241d, is supplied to the process chamber 201 through the nozzles 249a and 249b and the buffer chamber 237.

In this step, the process conditions are as follows.

The supply flow rate of the DCS gas is 1 sccm to 2,000 sccm, and preferably 10 sccm to 1,000 sccm, the supply flow rate (per gas supply pipe) of the $N_2$ gas is 0 sccm to 10,000 sccm, the supply time of each gas is 1 second to 120 seconds, and preferably 1 second to 60 seconds, the process temperature is 150° C. to 600° C., and preferably 250° C. to 450° C., and the process pressure is 1 Pa to 2,666 Pa, and preferably 67 Pa to 1,333 Pa.

By supplying the DCS gas to the wafers 200 under the above condition, a Si-containing layer including Cl is formed as the first layer on an outermost surface of the wafer 200. The Si-containing layer including Cl is formed on the outermost surface of the wafer 200 by the physical adsorption of the DCS, the chemical adsorption of the material obtained by decomposing a part of the DCS (hereinafter, $SiH_xCl_y$), the thermal decomposition of the DCS, and the like. The Si-containing layer including Cl may be an adsorption layer (physical adsorption layer or chemical adsorption layer) of DCS or $SiH_xCl_y$, or may be a Si layer including Cl.

In the present disclosure, the Si-containing layer including Cl is simply referred to as a Si-containing layer.

After the first layer is formed on the wafer 200, the valve 243a is closed and the supply of the DCS gas into the process chamber 201 is stopped. Therefore, the inside of the process chamber 201 is vacuum-exhausted, so that the gas or the like remaining in the process chamber 201 is exhausted from the process chamber 201. In this case, the valves 243c and 243d are opened to supply a $N_2$ gas into the process chamber 201. The $N_2$ gas acts as a purge gas.

As the precursor gas, in addition to the DCS gas, a chlorosilane-based gas such as a monochlorosilane ($SiH_3Cl$, abbreviated to MCS) gas, a trichlorosilane ($SiHCl_3$, abbreviated to TCS) gas, a tetrachlorosilane ($SiCl_4$, abbreviated to STC) gas, a hexachlorodisilane ($Si_2Cl_6$, abbreviated to HCDS) gas, or an octachlorotrisilane ($Si_3Cl_8$, abbreviated to OCTS) gas can be used. In addition, as the precursor gas, a tetrafluorosilane ($SiF_4$) gas, a tetrabromosilane ($SiBr_4$) gas, a tetraiodosilane ($SiI_4$) gas, or the like can be used. That is, as the precursor gas, various halosilane-based gases such as a chlorosilane-based gas, a fluorosilane-based gas, a bromo-silane-based gas, and an iodosilane-based gas can be used.

In addition, as the precursor gas, various aminosilane-based gases such as bis(diethylamino)silane ($SiH_2[N(C_2H_5)_2]_2$, abbreviated to BDEAS) gas, a bis(tertiary butylamino)silane ($SiH_2[NH(C_4H_9)]_2$, abbreviated to BTBAS) gas, a tris(diethylamino)silane ($SiH[N(C_2H_5)_2]_3$, abbreviated to 3DEAS) gas, a tris(dimethylamino)silane ($SiH[N(CH_3)_2]_3$, abbreviated to 3DMAS) gas, a tetrakis(diethylamino)silane ($Si[N(C_2H_5)_2]_4$, abbreviated to 4DEAS) gas, and a tetrakis(dimethylamino)silane ($Si[N(CH_3)_2]_4$, abbreviated to 4 DMAS) gas can be used.

Besides the $N_2$ gas, various rare gases, such as an Ar gas, a He gas, a Ne gas, or a Xe gas, may also be used as the purge gas. This point is also the same as in steps B and C to be described below.

[Step B]

After step A is completed, a plasma-excited $NH_3$ gas ($NH_3^*$) is supplied to the wafer 200 in the process chamber 201, that is, the first layer formed on the wafer 200.

Specifically, the opening and closing control of the valves 243b, 243 c, and 243d is performed in the same procedure as the opening and closing control of the valves 243a, 243c, and 243d in step A, while applying RF power between the rod-shaped electrodes 269 and 270. The $NH_3$ gas, the flow rate of which is controlled by the MFC 241b, is supplied to the process chamber 201 through the nozzle 249b and the buffer chamber 237 and is exhausted from the exhaust pipe 231. At this time, the plasma-excited $NH_3$ gas ($NH_3^*$) is supplied to the wafer 200. It should be noted that the $NH_3$ gas is excited (activated) by plasma when passing through the buffer chamber 237, and at that time, an active species such as $NH_3^*$ is generated, and the active species is supplied to the wafer 200. In the present disclosure, the plasma-excited $NH_3$ gas is also referred to as $NH_3^*$ for convenience.

As the process conditions in this step, the supply flow rate of the $NH_3$ gas is 100 sccm to 10,000 sccm and the RF power is 50 W to 1,000 W. The other process conditions are the same as the process conditions in step A. It should be noted that the process conditions exemplified here are conditions that enable active $NH_3^*$ to uniformly spread to the lower portion of the trench or the surroundings thereof in addition to the upper portion of the trench formed in the surface of the wafer 200.

Figure 5A:
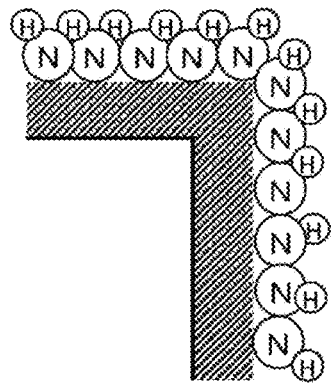
FIG. 5A is a schematic diagram illustrating a surface state of a second layer formed on an upper portion of a trench.
Figure 5B:
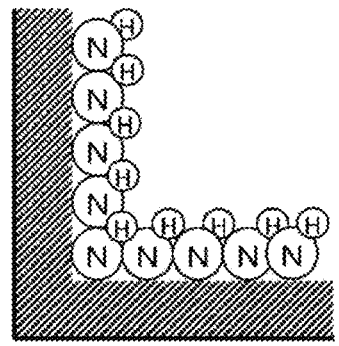
FIG. 5B is a schematic diagram illustrating a surface state of a second layer formed on a lower portion of a trench.

By supplying the $NH_3^*$ to the wafer 200 under the above-described condition, at least a part of the first layer formed on the wafer 200 in step A is nitrided. By nitriding the first layer, a silicon nitride layer (SiN layer) including Si and N is formed as the second layer on the wafer 200. The surface of the second layer is nitrided by $NH_3^*$ and NH-terminated. FIG. 5A is a schematic diagram illustrating the surface state of the second layer formed on the upper portion of the trench, and FIG. 5B is a schematic diagram illustrating the surface state of the second layer formed on the lower portion of the trench. As described above, under the process conditions in this step, it is possible to supply active $NH_3^*$ to the entire surface of the first layer in an active state without deactivation. As a result, it is possible to uniformly NH terminate the surface of the second layer obtained by nitriding the first layer from the upper portion to the lower portion of the trench. When forming the second layer, impurities such as Cl included in the first layer are separated from the first layer by being pulled out or desorbed from the first layer during the nitriding reaction by $NH_3^*$.

After forming the second layer whose surface is NH-terminated on the wafer 200, the valve 243b is closed and the application of the RF power to the rod-shaped electrodes 269 and 270 is stopped, so that the supply of $NH_3^*$ to the process chamber 201 is stopped. Then, the gas and the like remaining in the process chamber 201 are removed from the inside of the process chamber 201 by the same process procedure as in step A.

Besides the $NH_3$ gas, the hydrogen nitride-based gas such as a diazene ($N_2H_2$) gas, a hydrazine ($N_2H_4$) gas, or a $N_3H_8$ gas can be used as the reactant gas.

[Step C]

After step B is completed, a plasma-excited $N_2$ gas ($N_2^*$) is supplied to the wafer 200 in the process chamber 201, that is, the second layer having the NH-terminated surface.

Specifically, while applying RF power to the rod-shaped electrodes 269 and 270, the valve 243d is opened so that the $N_2$ gas flows into the gas supply pipe 232d. The $N_2$ gas, the flow rate of which is controlled by the MFC 241d, is supplied to the process chamber 201 through the nozzle 249b and the buffer chamber 237 and is exhausted from the exhaust pipe 231. At this time, the plasma-excited $N_2$ gas ($N_2^*$) is supplied to the wafer 200. It should be noted that the $N_2$ gas is excited (activated) by plasma when passing through the buffer chamber 237, and at that time, an active species such as $N_2^*$ is generated, and the active species is supplied to the wafer 200. In the present disclosure, the plasma-excited $N_2$ gas is referred to as $N_2^*$ for convenience.

As the process conditions in this step, the supply flow rate of the plasma-excited $N_2$ gas is 10 sccm to 5,000 sccm, the RF power is 1 W to 500 W, and the process pressure is 10 Pa to 3,333 Pa, and more preferably 67 Pa to 2,666 Pa. The other process conditions are the same as the process conditions in step A. It should be noted that the process conditions exemplified here are conditions that the active $N_2^*$ can be mainly supplied to the upper portion of the trench or the surroundings thereof alone. In other words, it is a condition that it is possible to deactivate $N_2^*$ before reaching the lower portion of the trench or the surroundings thereof, and to supply little or no active $N_2^*$ to these regions.

Figure 5C:
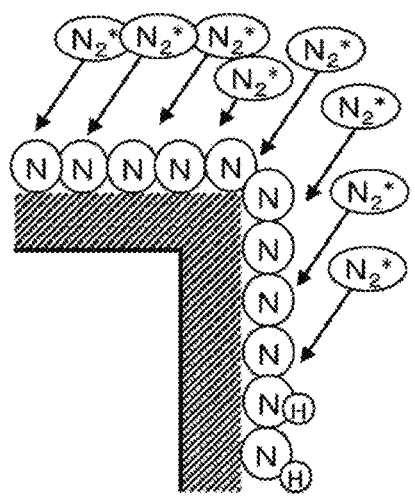
FIG. 5C is a schematic diagram illustrating a state of modifying a part of NH termination in the second layer formed on the upper portion of the trench.
Figure 5D:
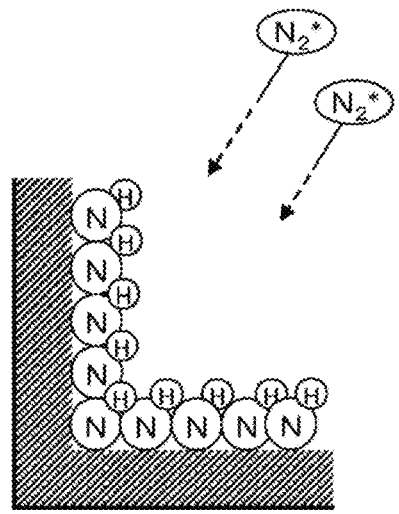
FIG. 5D is a schematic diagram illustrating a state of maintaining NH termination in the second layer formed on the lower portion of the trench as it is without modification.

By supplying the $N_2^*$ to the wafer 200 under the above-described condition, at least a part of the surface of the second layer formed on the wafer 200 in step B can be modified. That is, it is possible to desorb H from some NH termination of the NH termination present on the surface of the second layer and to modify (change) it to N termination. As described above, under the process condition in this step, the active $N_2^*$ is mainly supplied to the upper portion of the trench or the surroundings thereof alone, and little or no supply is made to the lower portion of the trench or the surroundings thereof. Therefore, in the present embodiment, the above-described modifying process is performed mainly on the surface of the second layer formed on the wafer 200 mainly in the upper portion of the trench or the surroundings thereof alone, and it is possible to make it hardly or never proceed in the lower portion of the trench and the surroundings thereof. As a result, among the NH terminations present on the surface of the second layer, for the other part different from the above-described part of the NH termination that can be modified to the N termination, it is possible to maintain the NH termination as it is without modification to the N termination. FIG. 5C is a schematic diagram illustrating a state of modifying a part of NH termination in the second layer formed on the upper portion of the trench to the N termination, and FIG. 5D is a schematic diagram illustrating a state of maintaining NH termination in the second layer formed on the lower portion of the trench as it is without modification.

By performing this step, it is possible to make an N termination ratio in the upper portion of the trench of the second layer higher than an N terminal ratio in the lower portion of the trench of the second layer. In addition, by performing this step, it is possible to make an NH termination ratio in the lower portion of the trench of the second layer higher than an NH termination ratio in the upper portion of the trench of the second layer. That is, by performing this step, it is possible to make an N/NH termination ratio in the upper portion of the trench of the second layer higher than an N/NH termination ratio in the lower portion of the trench of the second layer. The N termination ratio described here is the ratio of the N termination amount to the total amount of the N termination amount (the number of N terminations present on the surface) and the NH termination amount (the number of NH terminations present on the surface) per unit area of the surface of the second layer [=N termination amount/(N termination amount+NH termination amount)]. In addition, the NH termination ratio described here is the ratio of the NH terminal amount to the total amount of the N terminal amount and the NH terminal amount per unit area of the surface of the second layer [=NH termination amount/(N termination amount+NH termination amount)]. In addition, the N/NH termination ratio described here is the ratio of the N termination amount to the NH termination amount per unit area of the surface of the second layer [=N termination amount/NH termination amount].

Figure 5E:
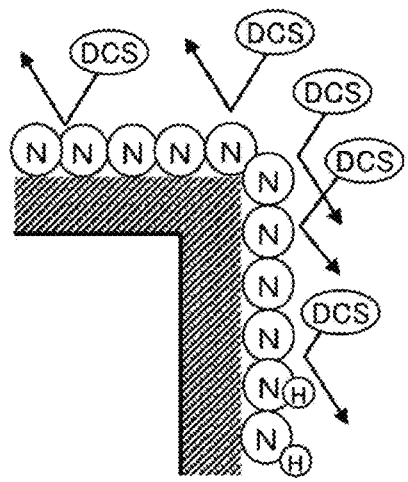
FIG. 5E is a schematic diagram illustrating a state of supplying a precursor gas to the modified second layer formed on the upper portion of the trench.
Figure 5F:
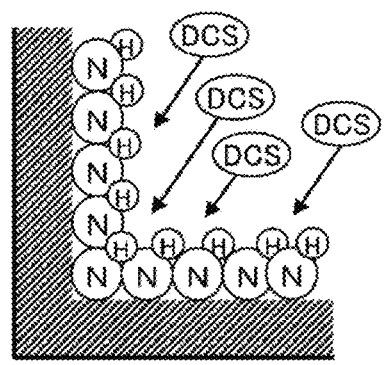
FIG. 5F is a schematic diagram illustrating a state of supplying a precursor gas to the second layer formed on the lower portion of the trench.

The N termination present on the surface of the second layer acts to suppress adsorption of Si included in the DCS gas to the surface of the second layer when performing step A in the next cycle. On the other hand, the NH termination present on the surface of the second layer acts to promote adsorption of Si included in the DCS gas to the surface of the second layer when performing step A in the next cycle. Therefore, by performing this step and setting the N termination ratio in the upper portion of the trench of the second layer to be higher than the N termination ratio in the lower portion of the trench of the second layer, that is, by setting the NH termination ratio in the lower portion of the trench of the second layer to be higher than the NH termination ratio in the upper part of the trench of the second layer, when performing step A in the next cycle, adsorption of Si included in the DCS gas to the surface of the second layer can be suppressed on the upper portion of the trench or the surroundings thereof, and on the other hand, adsorption of Si included in the DCS gas to the surface of the second layer can be promoted on the lower portion of the trench or the surroundings thereof. FIG. 5E is a schematic diagram illustrating a state of supplying the DCS gas to the second layer (the second layer modified to have the N-terminated surface) formed on the upper portion of the trench, and FIG. 5F is a schematic diagram illustrating a state of supplying the DCS gas to the second layer (the second layer maintaining the NH termination on the surface thereof) formed on the lower portion of the trench.

As a result, it is possible to promote the formation of the first layer in the lower portion of the trench or the surroundings thereof while suppressing the formation of the first layer in the upper portion of the trench or the surroundings thereof. In this case, the thickness of the first layer and the second layer formed on the lower portion of the trench in the next cycle becomes thicker than the thickness of the first layer and the second layer formed on the upper part of the trench in the next cycle. That is, the thickness of the SiN layer formed on the lower portion of the trench per cycle is greater than the thickness of the SiN layer formed on the upper portion of the trench per cycle. As a result, it is possible to realize the bottom-up film formation in which the filling with the SiN film gradually proceeds from the lower portion to the upper portion of the trench and it is possible to avoid occurrence of seams or voids in the trench.

Figure 6A:
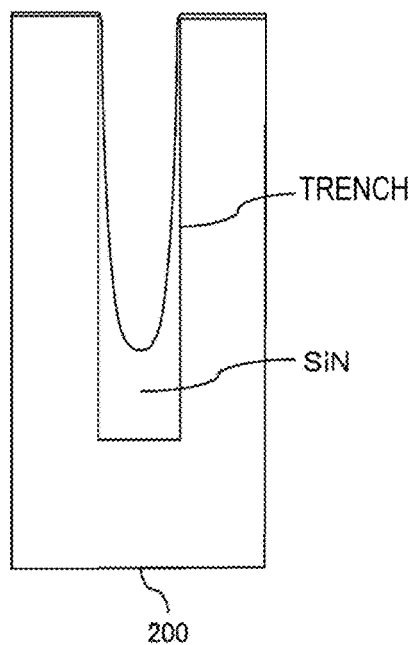
FIG. 6A is a wafer enlarged cross-sectional view illustrating a state when a bottom-up film formation is performed on a substrate having a pattern including a trench formed in a surface thereto.
Figure 6B:
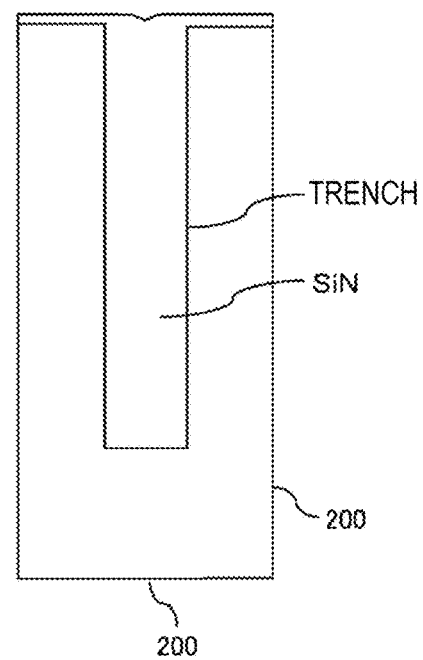
FIG. 6B is a wafer enlarged cross-sectional view illustrating a state after the trench is filled with a nitride film by performing the bottom-up film formation.
Figure 7:
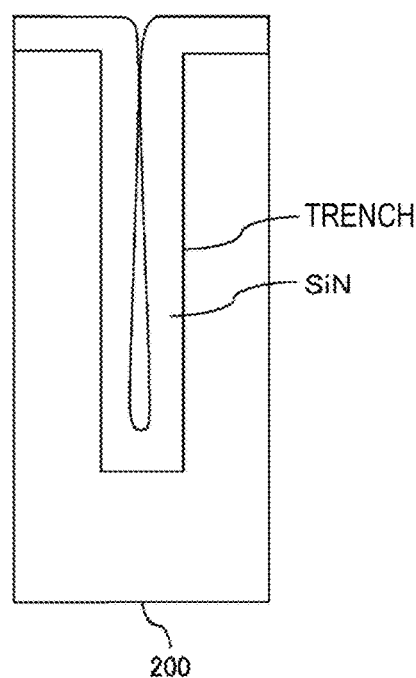
FIG. 7 is a wafer enlarged cross-sectional view illustrating a state in which a seam is formed in a trench when filling with a nitride film in a trench is performed.

FIG. 6A is a wafer enlarged cross-sectional view illustrating a state when a bottom-up film formation is performed on the wafer 200 having a pattern including a trench formed in the surface, and FIG. 6B is a wafer enlarged cross-sectional view illustrating a state after the trench is filled with a SiN film without gaps by performing the bottom-up film formation. In a case where step C is not performed in the film-forming process, as illustrated in FIG. 7, the SiN film is grown to close the upper portion of the trench formed in the surface of the wafer 200. Therefore, the supply of the DCS gas or the like to the inside of the trench is hindered, and as a result, seams and voids may be generated in the trench. It should be noted that such a problem arises when the vertical sectional shape of the trench formed in the surface of the wafer 200 is inversely tapered, that is, when the width of the trench gradually narrows from the lower portion to the upper portion of the trench.

In addition, in this step, it is possible to make the N termination ratio in the upper portion of the trench of the second layer higher than the NH termination ratio in the upper portion of the trench of the second layer by optimizing the process condition at the time of supplying $N_2^*$. In addition, it is possible to make the NH termination ratio in the lower portion of the trench of the second layer higher than the N terminal ratio in the lower portion of the trench of the second layer. In such a case, in step A in the next cycle, the above-mentioned effect of promoting the formation of the first layer on the lower portion of the trench can be more reliably obtained while suppressing the formation of the first layer to the upper portion of the trench. In other words, it is possible to more reliably progress the bottom-up film formation inside the trench and more reliably avoid the occurrence of seams or the like in the trench.

In order to obtain the effect described here, it is preferable to perform step C under the condition that the active $N_2^*$ is mainly supplied to the upper portion of the trench or the surroundings thereof alone, and is little or not supplied to (not reach) the lower portion of the trench or the surroundings thereof. For example, if the process pressure in step C is made larger than the process pressure in step B, it is possible to appropriately shorten the lifetime of the active $N_2^*$, and the effect described here can be reliably obtained. In addition, for example, even if the RF power in step C is made smaller than the RF power in step B, it is possible to appropriately shorten the lifetime of the active $N_2^*$, and the effect described here can be reliably obtained. In addition, for example, if the supply time of $N_2^*$ in step C is made shorter than the supply time of $NH_3^*$ in step B, the probability that the active $N_2^*$ will reach the lower portion of the trench or the surroundings thereof can be lowered, and the effect described here can be reliably obtained.

After performing the necessary modifying process on a part of the surface of the second layer, the valve 243d is closed and the application of RF power to the rod-shaped electrodes 269 and 270 is stopped, so that the supply of the $N_2^*$ to the process chamber 201 is stopped. Then, the gas and the like remaining in the process chamber 201 are removed from the inside of the process chamber 201 by the same process procedure as in step A.

[Performing Predetermined Number of Times]

By performing non-simultaneously steps A to C, that is, by alternately performing a cycle a predetermined number of times (n times, n is an integer of 1 or more) without synchronization, the SiN film is formed on the pattern including the trench formed in the surface of the wafer 200, and at that time, it is possible to fill the trench with the SiN film without gaps by the bottom-up film formation.

(After-Purge and Returning to Atmospheric Pressure)

When the film-forming step is completed, the $N_2$ gas as the purge gas is supplied from each of the gas supply pipes 232c and 232d to the process chamber 201 and is exhausted from the exhaust pipe 231. Therefore, the inside of the process chamber 201 is purged so that the reaction by-product or the gas remaining in the process chamber 201 is removed from the process chamber 201 (after-purge). After that, the atmosphere in the process chamber 201 is replaced with the inert gas (inert gas replacement) and the pressure in the process chamber 201 is returned to the atmospheric pressure (returning to atmospheric pressure).

(Boat Unloading and Wafer Discharging)

The seal cap 219 is moved downward by the boat elevator 115 to open the lower end of the manifold 209. After that, the processed wafer 200 is unloaded from the lower end of the manifold 209 to the outside of the reaction tube 203 in a state of being supported to the boat 217 (boat unloading). After the boat unloading, the shutter 219s is moved and the lower end of the manifold 209 is sealed through the O-ring 220c by the shutter 219s (shutter closing). After the processed wafers 200 are unloaded to the outside of the reaction tube 203, the processed wafers 200 are discharged from the boat 217 (wafer discharging).

(3) Effects of Present Embodiment

According to the present embodiment, one or more effects described below are exhibited.

(a) By performing step C after forming the second layer whose surface is NH-terminated, it is possible to make the N termination ratio in the upper portion of the trench of the second layer higher than the N termination ratio in the lower portion of the trench of the second layer. Therefore, it is possible to cause the SiN film to fill the trench from the lower portion to the upper portion thereof (bottom-up film formation). As a result, the occurrence of seams and voids in the trench can be avoided.

(b) By performing step C after forming the second layer whose surface is NH-terminated, it is possible to make the NH termination ratio in the lower portion of the trench of the second layer higher than the NH termination ratio in the upper portion of the trench of the second layer. Therefore, it is possible to reliably progress the bottom-up film formation inside the trench and reliably avoid the occurrence of seams or the like in the trench.

(c) By performing step C after forming the second layer whose surface is NH-terminated, it is possible to make the N/NH termination ratio in the upper portion of the trench of the second layer higher than the N/NH termination ratio in the lower portion of the trench of the second layer. Therefore, it is possible to reliably progress the bottom-up film formation inside the trench and reliably avoid the occurrence of seams or the like in the trench.

(d) By performing step C after forming the second layer whose surface is NH-terminated, it is possible to make the N termination ratio in the upper portion of the trench of the second layer higher than the NH termination ratio in the upper portion of the trench of the second layer. In addition, it is possible to make the NH termination ratio in the lower portion of the trench of the second layer higher than the N terminal ratio in the lower portion of the trench of the second layer. Therefore, it is possible to more reliably progress the bottom-up film formation inside the trench and more reliably avoid the occurrence of seams or the like in the trench.

(e) The above-described effect can also be obtained in a case where a silane-based gas other than the DCS gas is used as the precursor gas, or when a hydrogen nitride-based gas other than the $NH_3$ gas is used as the reactant gas.

(4) Modification Examples

The present embodiment can be modified as in the following modification examples. In addition, these modification examples can be arbitrarily combined.

Modification Example 1

For example, as in the film-forming sequence provided below, in step B, the $NH_3$ gas may not be plasma-excited, but may be thermally excited.

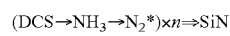

$(DCS \rightarrow NH_3 \rightarrow N_2^*) \times n \Rightarrow SiN$

In this case as well, it is possible to form the SiN film on the wafer 200 as in the film formation sequence illustrated in FIG. 4, and it is possible to cause the SiN film to fill the trench from the lower portion to the upper portion thereof (bottom-up film formation). In this modification example as well, this effect can be more reliably obtained by making the supply time of $N_2^*$ in step C shorter than the supply time of the $NH_3$ gas in step B.

Modification Example 2

For example, when the cycle is performed plural times, the process pressure in step C may be made gradually smaller as the cycle is repeated while the process pressure in step C is set to be larger than the process pressure in step B.

In addition, for example, when the cycle is performed plural times, the RF power in step C may be made gradually larger as the cycle is repeated while the RF power in step C is set to be smaller than the RF power in step B.

In addition, for example, when the cycle is performed plural times, the supply time of the $N_2^*$ in step C may be made gradually longer as the cycle is repeated while the supply time of the $N_2^*$ in step C is made shorter than the supply time of the $NH_3^*$ in step B.

In addition, for example, when the cycle is performed a predetermined number of times, step C may be performed in the initial to middle stage, and step C may not be performed in the middle to final stages.

In these cases as well, it is possible to realize the bottom-up film formation similarly to the film formation sequence illustrated in FIG. 4. In addition, when the cycle is performed plural times, it is possible to increase the film formation rate from the initial stage to the final stage, and the productivity of the film formation process can be improved.

OTHER EMBODIMENTS

The embodiments of the present disclosure have been described in detail. However, the present disclosure is not limited to the above-described embodiments, and various modifications can be made without departing from the scope of the present disclosure.

In addition, the present disclosure can be suitably applied to a case of forming a nitride film (metal nitride film) including a metal element, such as titanium (Ti), zirconium (Zr), hafnium (Hf), tantalum (Ta), niobium (Nb), molybdenum (Mo), tungsten (W), yttrium (Y), strontium (Sr), lanthanum (La), ruthenium (Ru), or aluminum (Al), as a main element.

For example, the present disclosure can be suitably applied to a case of forming a metal nitride film, such as a titanium nitride film (TiN film), a hafnium nitride film (HfN film), a tantalum nitride film (TaN film), or an aluminum nitride film (AlN film) on the wafer 200 according to the following film-forming sequence by using, for example, a titanium tetrachloride ($TiCl_4$) gas, a hafnium tetrachloride ($HfCl_4$) gas, a tantalum pentachloride ($TaCl_5$) gas, or a trimethylaluminum ($Al(CH_3)_3$, abbreviated to TMA) gas as a precursor gas.

$(TiCl_4 \rightarrow NH_3 \rightarrow N_2^*) \times n \Rightarrow TiN$ $(HfCl_4 \rightarrow NH_3 \rightarrow N_2^*) \times n \Rightarrow HfN$ $(TaCl_3 \rightarrow NH_3 \rightarrow N_2^*) \times n \Rightarrow TaN$ $(TMA \rightarrow NH_3 \rightarrow N_2^*) \times n \Rightarrow AlN$ The process sequence and the process condition at this time can be the same as the process sequence and the process condition in the above-described embodiments or modification examples. In these cases, the same effects as those of the embodiments or the modification example described above can also be obtained. That is, the present disclosure can be suitably applied to a case of forming a semiconductor metal nitride film including a semiconductor element such as Si as a main component or the case of forming a metal nitride film including the above-mentioned various metal elements as main component.

In addition, for example, the present disclosure can be suitably applied to a case where a substrate having a pattern including a concave portion such as a hole formed in a surface thereof in addition to the concave portion such as the trench is used as the wafer 200. In this case, "trench" in the above description may be replaced with "hole". In this case, the same effects as those of the embodiments or the modification example described above can also be obtained.

It is preferable that the recipe used in the substrate processing is individually prepared according to the contents of the processing and are stored in the memory device 121c through the electric communication line or the external memory device 123. It is preferable that, when the substrate processing is started, the CPU 121a appropriately selects a suitable recipe from the plurality of recipes stored in the memory device 121c according to the contents of the substrate processing. Therefore, films having various film types, composition ratios, film qualities, and film thicknesses can be formed with excellent reproducibility by using a single substrate processing apparatus. In addition, since the workload of an operator can be reduced, various processes can be promptly started while avoiding operation mistake.

The above-described recipe is not limited to the case of newly creating a process recipe. For example, the process recipe may be prepared by modifying an existing recipe having already been installed on the substrate processing apparatus. When the recipe is modified, the modified recipe may be installed on the substrate processing apparatus through the telecommunication line or the non-transitory computer-readable recording medium recording the corresponding recipe. In addition, the existing recipe having already been installed on the substrate processing apparatus may be directly modified by operating the I/O device 122 provided in the existing substrate processing apparatus.

In the above-described embodiments, the example of forming the film by using a batch-type substrate processing apparatus which processes a plurality of sheets of substrates at a time has been described. However, the present disclosure is not limited to the above-described embodiments. For example, the present disclosure can be suitably applied to the case of forming a film by using a single-wafer-type substrate processing apparatus which processes one substrate or several substrates at a time. In addition, in the above-described embodiments, the example of forming the film by using a substrate processing apparatus provided with a hot-wall type furnace has been described. However, the present disclosure is not limited to the above-described embodiments. For example, the present disclosure can be preferably applied to the case of forming a film by using a substrate processing apparatus provided with a cold-wall type furnace.

Even when these substrate processing apparatuses are used, the film-forming process can be performed under the same process procedures and process conditions as those of the above-described embodiments and modification examples, and the same effects as those of the above-described embodiments or modification examples can be obtained.

In addition, the above-described embodiments or modification examples can be used in combination as appropriate. The process procedures and process conditions at this time can be the same as the process procedures and process conditions of the above-described embodiment.

EXAMPLES

Hereinafter, examples will be described.

As Samples 1 to 3, a SiN film was formed on a pattern including a trench formed in a surface of a wafer according to the film formation sequence illustrated in FIG. 4 by using the substrate processing apparatus illustrated in FIG. 1. The process condition in step C when Samples 1 to 3 were prepared was a condition within the process condition range in step C of the film-forming sequence illustrated in FIG. 4, and was a condition in which the active $N_2^*$ could mainly reach the upper portion of the trench and the active $N_2^*$ hardly or never reached the lower portion of the trench. It should be noted that the process condition in step C was set such that the active $N_2^*$ hardly reached the lower portion of the trench in the order of Samples 1, 2, and 3 (Sample 3 was hardest to reach). The other process conditions were predetermined conditions within the process condition range in the film-forming sequence illustrated in FIG. 4.

As Sample 4, by using the substrate processing apparatus illustrated in FIG. 1, a SiN film was formed on a pattern including a trench formed in a surface of the wafer by repeating a cycle including alternately performing supplying a DCS gas to a wafer and supplying $NH_3^*$ to the wafer. When preparing Sample 4, the step of supplying $N_2^*$ to the wafer was not performed. The other process conditions were the same as those in preparing Samples 1 to 3.

Figure 8:
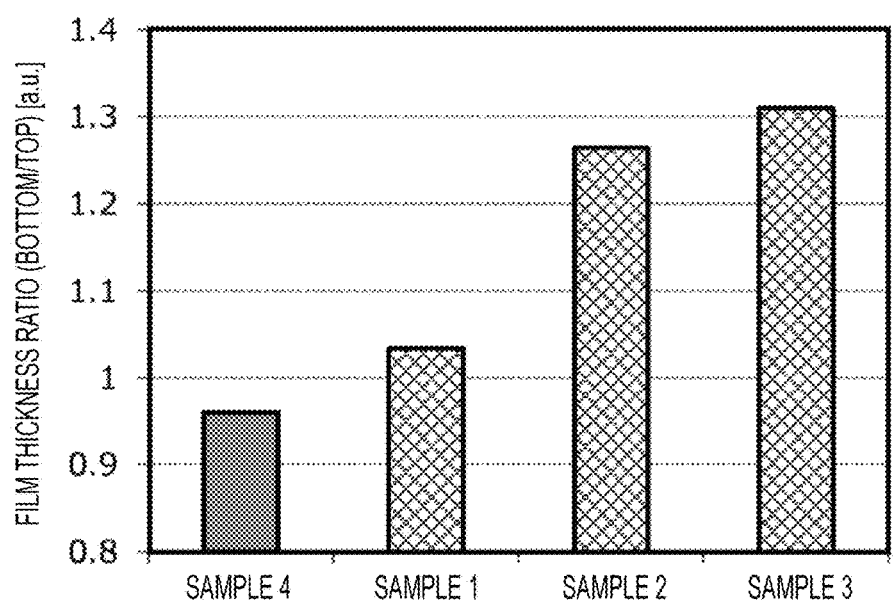
FIG. 8 is a diagram illustrating an evaluation result of a ratio of a thickness of the nitride film formed on the lower portion of the trench to a thickness of the nitride film formed on the upper portion of the trench.

For each of the SiN films of Samples 1 to 4, the film thicknesses at the lower portion of the trench and the upper portion of the trench were measured, and the ratio in the film thicknesses was evaluated. FIG. 8 shows the results. In FIG. 8, a vertical axis represents the ratio of the thickness (bottom/top) of the SiN film formed on the lower portion of the trench to the thickness of the SiN film formed on the upper portion of the trench [a. u.], and a horizontal axis represents Samples 4 and 1 to 3 in order.

According to FIG. 8, the thickness ratios in Samples 1 to 3 are larger than the film thickness ratio in Sample 4, and the film thickness (deposition rate) of the SiN film formed on the lower portion of the trench is thicker (larger) than the film thickness (deposition rate) of the SiN film formed on the upper portion of the trench. That is, the film-forming technique of Samples 1 to 3 for performing step C of supplying $N_2^*$ to the wafer is easy to realize the bottom-up film formation, as compared to the film-forming method of Sample 4 in which the step corresponding to Step C is not performed. In addition, the above-mentioned film thickness ratio in Sample 2 is larger than the film thickness ratio in Sample 1, and the film thickness ratio in Sample 3 is larger than the film thickness ratio in Sample 2. Therefore, it can be seen that the bottom-up film formation can be more reliably realized by making the process condition in step C such that the active $N_2^*$ hardly reaches the lower portion of the trench.

According to the present disclosure, when a nitride film is formed on a pattern including a concave portion formed in a surface of a substrate, filling characteristics can be improved by the nitride film in the concave portion.

What is claimed is:

1. A method of manufacturing a semiconductor device, comprising:
    forming a nitride film on a pattern including a concave portion formed in a surface of a substrate by repeating a cycle including non-simultaneously performing:
    (a) forming a first layer by supplying a precursor gas to the substrate;
    (b) forming a NH-terminated second layer by supplying a hydrogen nitride-based gas to the substrate to nitride the first layer; and
    (c) modifying a part of a NH termination in the NH-terminated second layer to an N termination, and maintaining another part of the NH termination as it is without modifying the another part to the N termination by plasma-exciting and supplying a nitrogen gas to the substrate,
    wherein in (c), an N termination ratio of the NH-terminated second layer in an upper portion of the concave portion of the pattern is made higher than an N termination ratio of the NH-terminated second layer in a lower portion of the concave portion of the pattern.

2. The method according to claim 1, wherein in (c), an NH termination ratio of the NH-terminated second layer in the lower portion of the concave portion of the pattern is made higher than an NH termination ratio of the NH-terminated second layer in the upper portion of the concave portion of the pattern.

3. The method according to claim 1, wherein in (c), an N/NH termination ratio of the NH-terminated second layer in the upper portion of the concave portion of the pattern is made higher than an N/NH termination ratio of the NH-terminated second layer in the lower portion of the concave portion of the pattern.

4. The method according to claim 1, wherein in (c), an N termination ratio of the NH-terminated second layer in the upper portion of the concave portion of the pattern is made higher than an NH termination ratio of the NH-terminated second layer in the upper portion of the concave portion of the pattern, and an NH termination ratio of the NH-terminated second layer in the lower portion of the concave portion of the pattern is made higher than an N termination ratio of the NH-terminated second layer in the lower portion of the concave portion of the pattern.

5. The method according to claim 1, wherein adsorption of an element included in the precursor gas to the upper portion of the concave portion of the pattern in (a) of a next cycle is suppressed by (c).

6. The method according to claim 1, wherein adsorption of an element included in the precursor gas to the lower portion of the concave portion of the pattern in (a) of a next cycle is promoted by (c).

7. The method according to claim 1, wherein the hydrogen nitride-based gas is plasma-excited and supplied in (b), and a pressure in a space in which the substrate is present in (c) is made larger than a pressure in a space in which the substrate is present in (b).

8. The method according to claim 1, wherein the hydrogen nitride-based gas is plasma-excited and supplied in (b), and a supply power when the nitrogen gas is plasma-excited in (c) is made smaller than a supply power when the hydrogen nitride-based gas is plasma-excited in (b).

9. The method according to claim 1, wherein the hydrogen nitride-based gas is plasma-excited and supplied in (b), and wherein a time for plasma-exciting and supplying the nitrogen gas in (c) is made shorter than a time for plasma-exciting and supplying the hydrogen nitride-based gas in (b).

10. The method according to claim 1, wherein the cycle is repeated to form the nitride film while a thickness of a layer formed on the lower portion of the concave portion of the pattern is made thicker than a thickness of a layer formed on the upper portion of the concave portion of the pattern.

11. The method according to claim 1, wherein the cycle is repeated to form the nitride film while a thickness of a layer formed by laminating the modified NH-terminated second layer formed on the lower portion of the concave portion of the pattern is made thicker than a thickness of a layer formed by laminating the modified NH-terminated second layer formed on the upper portion of the concave portion of the pattern.

12. The method according to claim 1, wherein the cycle is repeated to fill the concave portion of the pattern with the nitride film by realizing a bottom-up film formation by forming the nitride film while a thickness of a layer formed on the lower portion of the concave portion of the pattern is made thicker than a thickness of a layer formed on the upper portion of the concave portion of the pattern.

13. The method according to claim 1, wherein the cycle is repeated to fill the concave portion of the pattern with the nitride film by realizing a bottom-up film formation by forming the nitride film while a thickness of a layer formed by laminating the modified NH-terminated second layer formed on the lower portion of the concave portion of the pattern is made thicker than a thickness of a layer formed by laminating the modified NH-terminated second layer formed on the upper portion of the concave portion of the pattern.

14. The method according to claim 1, wherein the precursor gas comprises a halosilane-based gas.

15. The method according to claim 1, wherein the precursor gas comprises a chlorosilane-based gas.

16. The method according to claim 1, wherein the precursor gas comprises at least one selected from the group consisting of a monochlorosilane gas, a dichlorosilane gas, a trichlorosilane gas, a tetrachlorosilane gas, a hexachlorodisilane gas, and an octachlorotrisilane gas.

17. A substrate processing apparatus comprising:
a process chamber in which a substrate is processed;
a precursor gas supply system configured to supply a precursor gas to the substrate in the process chamber;
a hydrogen nitride-based gas supply system configured to supply a hydrogen nitride-based gas to the substrate in the process chamber;
a nitrogen gas supply system configured to supply a nitrogen gas to the substrate in the process chamber;
a plasma excitation unit configured to plasma-excite a gas; and
a controller configured to control the precursor gas supply system, the hydrogen nitride-based gas supply system, the nitrogen gas supply system, and the plasma excitation unit so as to form a nitride film on a pattern including a concave portion formed in a surface of the substrate in the process chamber by repeating a cycle including non-simultaneously performing: (a) forming a first layer by supplying the precursor gas to the substrate; (b) forming a NH-terminated second layer by supplying the hydrogen nitride-based gas to the substrate to nitride the first layer; and (c) modifying a part of a NH termination in the NH-terminated second layer to an N termination, and maintaining another part of the NH termination as it is without modifying the another part to the N termination by plasma-exciting and supplying the nitrogen gas to the substrate, wherein in (c), an N termination ratio of the NH-terminated second layer in an upper portion of the concave portion of the pattern is made higher than an N termination ratio of the NH-terminated second layer in a lower portion of the concave portion of the pattern.

18. A non-transitory computer-readable recording medium storing a program that causes, by a computer, a substrate processing apparatus to perform a process, in a process chamber of the substrate processing apparatus, the process comprising:
forming a nitride film on a pattern including a concave portion formed in a surface of the substrate by repeating a cycle including non-simultaneously performing:
(a) forming a first layer by supplying a precursor gas to the substrate;
(b) forming a NH-terminated second layer by supplying a hydrogen nitride-based gas to the substrate to nitride the first layer; and
(c) modifying a part of a NH termination in the NH-terminated second layer to an N termination, and maintaining another part of the NH termination as it is without modifying the another part to the N termination by plasma-exciting and supplying a nitrogen gas to the substrate,
wherein in (c), an N termination ratio of the NH-terminated second layer in an upper portion of the concave portion of the pattern is made higher than an N termination ratio of the NH-terminated second layer in a lower portion of the concave portion of the pattern.

* * * * *